METHOD OF PREPARING A SUBSTRATE FOR DEPOSITING A METAL ON SELECTED PORTIONS THEREOF

Filed Oct. 2, 1970

INVENTOR.
Nathan Feldstein
BY Arthur I. Spechler
ATTORNEY 3,672,925

METHOD OF PREPARING A SUBSTRATE FOR DEPOSITING A METAL ON SELECTED PORTIONS THEREOF

Nathan Feldstein, Kendall Park, N.J., assignor to RCA Corporation

Filed Oct. 2, 1970, Ser. No. 77,440
Int. Cl. B44d *1/52, 1/18*
U.S. Cl. 117—5.5 12 Claims

ABSTRACT OF THE DISCLOSURE

A method of preparing a substrate for the deposition of a metal on selected portions of the substrate surface by electroless plating, in the presence of a catalyst, comprises first covering the unselected portions of the substrate surface with a masking film that includes an oxidizing agent. The substrate, including the masking film, is then treated with a sensitizing solution and heated to cause the oxidizing agent to oxidize, and desensitize, the sensitizing solution that is adsorbed on the masking film, rendering the masking film incapable of accepting a catalyst. The substrate and masking film are next treated with a catalytic activating solution, and a thin layer of the catalyst is deposited only on the sensitized selected portions of the substrate surface.

BACKGROUND OF THE INVENTION

This invention relates generally to a method of preparing a substrate for the deposition of a metal on selected portions thereof, and more particularly to an improved technique for effecting the selective deposition wherein the metal is deposited from a solution in the presence of a suitable catalyst. The novel method is particularly useful for the selective electroless plating of a metal on a dielectric substrate.

By the term "selective electroless plating of metals" is meant the deposition of metals on preselected areas of a given substrate. There is a growing need, especially in the electronic industry, for such processes because they provide inexpensive techniques for the fabrication of semiconductor devices and printed circuits. For example, a selective electroless plating process is useful in preparing printed circuits, eliminating the need to etch copper-clad boards. Selective electroless plating is also useful for forming precision metal parts because it obviates the problems of undercutting commonly observed in prior-art metal plating methods that require etching operations.

It has been proposed in the prior art to deposit a metal selectively on a substrate by first covering those portions of the substrate that are not to be plated with a masking layer containing a catalyst-poisoning material. The entire substrate and the masking layer are then covered with a layer of the catalyst. The part of the catalyst layer that overlies the poisoning material is (poisoned) inactivated. Suitable photoresists with effective catalyst-poisoning materials, however, are extremely difficult to prepare, and many of the catalyst-poisoning materials are dangerous, toxic, and/or obnoxious to humans. Furthermore, the resolution capability of the deposited metal by this prior-art method leaves something to be desired.

Although there are several possible methods for initiating electroless plating on a dielectric substrate, the following two-step sequence is the most commonly employed. Firstly, the substrate is sensitized by immersing it in a sensitizing solution, such as an acidic solution of stannous chloride, rinsed in water; and, secondly, it is activated by dipping it into an activating solution, such as an acidic solution of palladium chloride and rinsed again. The following physical and chemical reactions take place during this sequence:

(1) Sensitization through stannous adsorption:

$$Sn^{+2} + \text{surface} \rightarrow \text{surface}.Sn^{+2}(\text{adsorbed})$$

(2) Activation through a galvanic replacement:

$$\text{surface}.Sn^{+2}(\text{adsorbed}) + Pd^{+2} \rightarrow \text{surface}.Pd(\text{adsorbed}) + Sn^{+4}$$

The detailed structure of the adsorbed stannous layer is not well understood, but it is believed that freshly deposited layers comprise a hydrated stannous oxide phase as well as a stannic oxide phase.

In order to achieve selectivity in the deposition of a metal layer by electroless plating, selective patterns of the catalytic nuclei are formed on the substrate. The novel method of preparing a dielectric substrate for the deposition of a metal on selective portions thereof provides means that obviate the use of catalytic-poisoning agents and the aforementioned disadvantages thereof. The novel method also obviates the necessity for using corrosive etchants in etch down processes, thereby eliminating the problems of pollution inherent with the use thereof.

SUMMARY OF THE INVENTION

The novel method of preparing a substrate for depositing a metal, in the presence of a catalyst, on selected portions of the substrate surface comprises depositing a masking film including an oxidizing agent, on the unselected portions of the substrate surface are treated with a sensitizer. The sensitizer that is adsorbed on the selected portions of the substrate surface sensitizes them to accept a layer of the catalyst, and the sensitizer that is adsorbed on the masking film is oxidized by the oxidizing agent in the masking film, thereby desensitizing the masking film and rendering it incapable of accepting a layer of the catalyst. The catalyst, in the form of a thin layer, is deposited from an activating solution only on the sensitized selected portions of the substrate. When the substrate is subsequently subjected to an electroless metal plating solution, the catalyst initiates the deposition of the metal only on the selected portions of the substrate surface.

In a preferred embodiment of the novel method, the substrate is heated after it is treated with the sensitizer to decrease the reaction time and to insure the complete oxidation of the sensitizer adsorbed on the masking film.

DESCRIPTION OF THE PREFERRED EMBODIMENT

Figure 5:
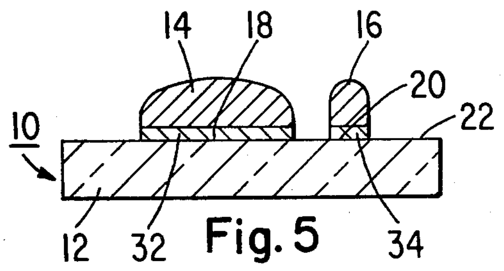
Figure 6:
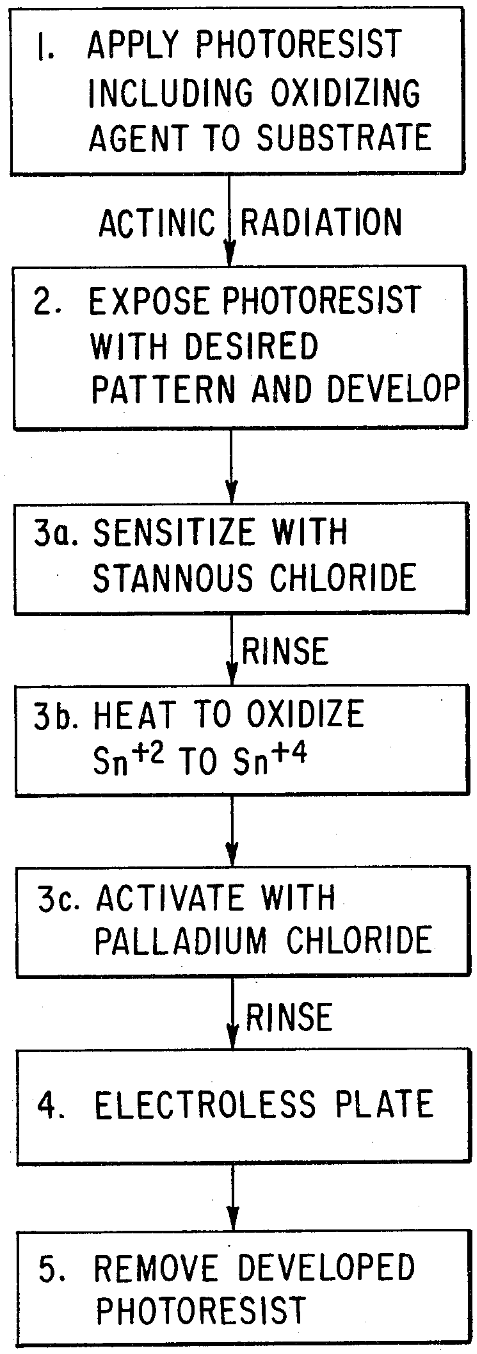
FIG. 6 is flow diagram of the aforementioned preferred embodiment, the numbered operations in the flow diagram corresponding to the numbered figures, respectively.

The novel method of preparing a substrate for the deposition of metal on selected portions of the substrate surface by electroless plating will be described for the manufacture of apparatus 10 (FIG. 5), which, for example, may be a portion of either a printed circuit or an integrated circuit. The apparatus 10 comprises a dielectric substrate 12 having metal deposits 14 and 16 on selected portions 18 and 20, respectively, of the upper substrate surface 22. The dielectric substrate 12 is electrically insulating material, such as glass, plastic material, semiconductor material, or the like, and the metal of the deposits for 14 and 16 is one such as nickel-phosphorus alloy or copper, for example, deposited from an electroless plating solution.

Figure 1:
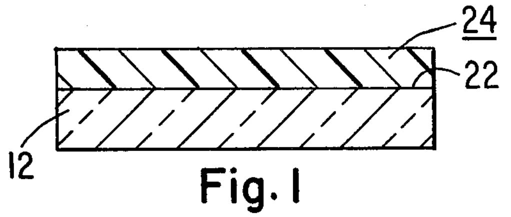
FIGS. 1–5 are cross-sectional views of a substrate at various steps of the novel method in a preferred embodiment thereof.

Referring now to FIG. 1 of the drawing, the substrate is shown in the initial step of the novel method. Means are provided to apply a masking film on the unselected portions of the substrate 12. To this end, a masking film 24, such as a photoresist of the standard polyvinyl alcohol-dichromate type, for example, is applied to the upper substrate surface 22 by any suitable means known in the art. The masking film 24 includes a small amount of an oxidizing agent, such as $KMnO_4$ or methyl orange, for the purpose hereinafter appearing. A suitable preparation for the masking film 24 is:

Formula 1

95 cc. of water and 5 g. of PVA (polyvinyl alcohol, "Elvanol," grade 50/42, E. I. du Pont de Nemours, Wilmington, Del.).
10 cc. of 5% $Na_2Cr_2O_7$, and
2 cc. of saturated $KMnO_4$ solution (oxidizing agent)

The masking film 24 is applied as a coating on the upper substrate surface 22, as by dipping the substrate 12 into the preparation, or by spinning the preparation on the surface 22 to obtain a relatively thin layer, or by spraying the preparation onto the substrate 12. The masking film 24 should have a thickness on the order of between about 0.2 and 1.0 micron. The masking film 24 is allowed to dry at room temperature.

Another suitable masking film 24, that can function as a suitable photoresist for the novel method, is the following preparation:

Formula 2

95 cc. of water and 5 g. of PVA (polyvinyl alcohol, "Elvanol," grade 50/42)
10 cc. of 5% $Na_2Cr_2O_7$, and
0.015 g. of methyl orange (oxidizing agent)

The masking film 24 of Formula 2 is applied in a manner similar to that of the preparation of Formula 1.

After drying, the photosensitive masking film 24 is exposed to actinic light through a suitable photo mask (not shown), in a manner known in the art, so that only those portions of the thin masking film 24 directly above the selected portions 18 and 20 of the upper substrate surface 22 (FIG. 2) are not exposed to the actinic radiation. Exposure to actinic radiation causes the exposed portions 26, 28, and 30 of the masking film 24 to harden (cross-link). When the masking film 24 is developed, as by treating the exposed masking film 24 with water, the unexposed portions of the masking film 24 are dissolved, uncovering the selected portions 18 and 20 of the substrate surface 22 on which ti is desired to deposit a metal selectively.

Figure 2:
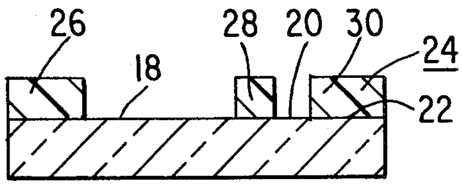

The unselected portions of the substrate surface 22, that is, those portions of the surface 22 upon which it is not desired to plate a metal, are covered by the hardened (polymerized) portions 26, 28, and 30 of the masking film 24, as shown in FIG. 2.

Means are provided to sensitize the selected portions 18 and 20 of the substrate surface 22 to accept a suitable catalyst for the subsequent electroless plating process, and to desensitize (prevent sensitization of) the surfaces of the portions 26, 28, and 30 of the masking film 24 so that they do not accept the catalyst. To this end, the selected portions 18 and 20 of the substrate surface 22 and the masking film 24, including the portions 26, 28 and 30, are treated with a sensitizer, such as a sensitizing solution of stannous chloride. A suitable composition for the sensitizing solution of stannous chloride is:

Formula 3

7 g. of stannous chloride ($SnCl_2.2H_2$),
4 cc. of 37% (by weight) HCl,
water to make one liter.

The assembly of the substrate 12 and the masking film 24, shown in FIG. 2, is immersed in the sensitizing solution for a short time which is not at all critical say between about 1 and 2 minutes, and subsequently rinsed in deionized water.

The following reaction is believed to take place at the interface of the selected portions 18 and 20 of the substrate surface 22.

SENSITIZATION BY THE STANNOUS IONS $$\text{surface}+SnCl_2(HCl)\rightarrow \text{surface}.Sn^{+2}\ (\text{adsorbed})$$

The adsorbed stannous ions on the selected portions 18 and 20 of the surface 22 provide means for a galvanic reaction which will take place during a subsequent activation treatment. The oxidizing agent, i.e. the $KMnO_4$ or the methyl orange, for example, in the masking film 24 has an oxidizing effect upon the adsorbed stannous ions that are on the masking film 24 and oxidizes them to stannic ions. The following reaction takes place:

$$Sn^{+2}\rightarrow Sn^{+4}+2\ \text{electrons}$$

Thus, although the stannous ions are initially adsorbed on the masking film 24, they become oxidized by the oxidizing agent, and thereby, are rendered ineffective as a sensitizer to accept a subsequently applied catalyst.

It was found that a mild heating of the assembly of the substrate 12 and the masking film 24 after the sensitization operation decreases the reaction time and insures a substantially complete desensitization of the adsorbed sensitizing solution on the masking film 24. Thus, heating the masking film 24 to a temperature of between about 50° C. and 200°C. for between about ½ and 5 minutes insures the substantially complete oxidation of the stannous ions to stannic ions. If the oxidizing agent in the masking film 24 is a relatively strong one, the heating step may be omitted. The assembly is rinsed in deionized water after the sensitizing operation.

Although acidic stannous chloride solution is a preferred sensitizer, other sensitizers capable of being oxidized such as acidic titanium trichloride solution, for example, may also be used. The latter solution has the following composition:

Formula 4

50 g. of titanium trichloride
50 ml. of hydrochloric acid
water to make one liter Titanium ions $T^{+1}$ are oxidized by the oxidizing agents to $T^{+3}$. Oxidized titanium ions ($T^{+3}$) adsorbed on the masking film 24 to render it incapable of accepting a catalyst.

After sensitizing the selected portions 18 and 20 of the surface 22 with stannous ions, the assembly of the substrate 12 and the masking film 24 is treated with an activator, such as an activating solution, as by immersing it in the following activating solution.

Formula 5

1 g. of palladium chloride ($PdCl_2$)
1 cc. of 37% (by weight) HCl, and
enough water to make one liter The immersion is carried out for a non-critical period of time preferably on the order of about one minute. The assembly is subsequently rinsed in deionized water. The sensitizing and activation solutions, Formulas 3, 4, and 5 may incorporate a small quantity (on the order of 1 mg./liter of solution) of a suitable wetting agent, such as Tergitol Non-Ionic NP–44, sold by Union Carbide.

The activation reaction is a galvanic replacement reaction, such as:

$$Pd^{+2}+\text{surface}.Sn^{+2}\rightarrow \text{surface}.Pd+Sn^{+4}$$

$$Pd^{+2}+\text{surface}.Ti^{+1}\rightarrow \text{surface}.Pd+Ti^{+3}$$

Thin layers 32 and 34 (FIG. 3), comprising palladium catalyst, are thus formed on the selected portions 18 and 20, respectively, of the surface 22 of the substrate 12. The layers 32 and 34 comprise finely divided (approximately 50 A. in diameter) catalytic palladium nuclei having an island-type structure. The average thickness of the layers 32 and 34 is less than that for monolayer coverage. It is the physical presence and chemical activity of the palladium catalyst, however, that are prerequisites for the initiation of the subsequent electroless plating of a metal on the layers 32 and 34.

No palladium catalyst is deposited on the masking film 24 because any stannous ions adsorbed thereon are oxidized to stannic ions by the oxidizing agent in the masking film 24, and the stannic ions are not replaced by palladium.

While the thin catalytic layers 32 and 34, according to the preferred embodiment of the novel method, comprise a palladium-containing material, other metals known in the art can also be employed to catalyze the subsequent electroless plating process. Such catalysts, for example, include rhodium, ruthenium, cobalt, nickel, gold and silver.

After the activation step, the assembly of the substrate 12 and the masking film 24 is rinsed in deionized water in preparation for the selective deposition of a metal on the catalytic layers 32 and 34.

Figure 3:
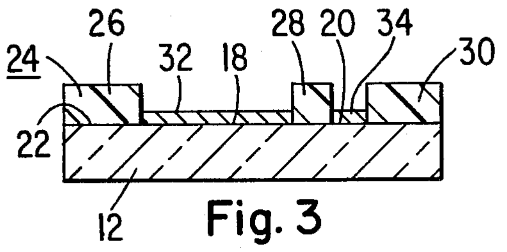

The operation for the selective deposition of a metal involves immersing the selectively "activated" structure, shown in FIG. 3, in an aqueous electroless metal plating bath, such as, for example, an electroless nickel (nickel-phosphorus alloy) plating bath having the following composition:

Formula 6

25 g. of nickel sulfate ($NiSO_4.6H_2O$)
50 g. of sodium pyrophosphate ($Na_4P_2O_7.10H_2O$)
25 g. of sodium hypophosphite ($NaH_2PO_2.H_2O$), and enough water to make one liter of solution The pH of the solution is adjusted with 15 molar solution of ammonium hydroxide ($NH_4OH$) within a range between about 9 and 11.5, a preferable value of pH being on the order of 10.5. The electroless plating of nickel is carried out at room temperature.

Figure 4:
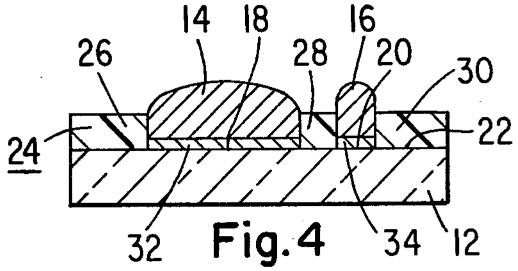

Since the surface of the portions 26, 28, and 30 of the masking film 24 have been desensitized and are free from catalytic palladium, a layer of electroless nickel-phosphorus alloy is deposited preferentially on the catalytic layers 32 and 34 as metal deposits 14 and 16, shown in FIG. 4. A small amount of a wetting agent may be included in the bath, if necessary.

After the nickel-phosphorus alloy metal deposits 14 and 16 have been deposited to a desired thickness, the substrate 12 is removed from the plating bath and rinsed in deionized water. The portions 26, 28, and 30 of the masking film 24 are subsequently removed (dissolved) from the substrate 12 by immersing the substrate 12 in an aqueous solution of hydrogen peroxide to provide the completed apparatus 10, shown in FIG. 5.

Although the novel method has been described with the use of photosensitive resists, for the masking film 24, the masking film 24 can be a resist that may be shaped into a suitable masking pattern by mechanically removing portions of the masking film 24, as by cutting, sand blasting, or other abrasion methods. A resist suitable for the latter operations, is, for example, Kodal Metal Etching Resist (KMER).

Instead of using $KMnO_4$ or methyl orange as an oxidizing agent, other oxidizing agents capable of oxidizing $Sn^{+2}$ to $Sn^{+4}$, such as sodium nitrate ($NaNO_3$), sodium bromate ($NaBrO_3$), or sodium clorate ($NaClO_3$), for example, may also be used for incorporating into the resist. The oxidizing agent should also be present in the masking film in a quantity sufficient to oxidize the sensitizer solution in at least five minutes at a temperature of about 200° C. or less.

Although the novel method of preparing a substrate for depositing a metal on selected portions thereon has been described in connection with the selective electroless deposition of a nickel-phosphorus alloy, it is evident that the novel method may be employed for the selective electroless deposition of other metals from solutions in the presence of the catalyst. For example, copper may be selectively deposited on the catalytic layers 32 and 34 from the following electroless copper plating bath:

Formula 7

5 g. of copper sulfate ($CuSO_4 \cdot 5H_2O$)
1.2 g. of paraformaldehyde
7.6 g. of n-hydroxyethylethylene-diaminetriacetic acid trisodium salt, dihydrate ($HEEDTANa_3 \cdot 2H_2O$)
add enough water to make one liter of solution This electroless copper plating bath is adjusted with potassium hydroxide to a pH of about 12 at 25° C. The bath may be utilized at room temperature and a small quantity of a suitable wetting agent may be added to the bath.

Cobalt may be selectively deposited on the catalytic layers 32 and 34 from the following electroless cobalt plating bath:

Formula 8

Cobalt chloride, hexahydrate—30 gm./l.
Sodium citrate, pentahydrate—35 gm./l.
Ammonium chloride—50 gm./l.
Sodium hypophosphite, monohydrate—20 gm./l.
pH (adjusted with $NH_4OH$)—9–10
Temperature—91–96° C.
Rate of deposition—0.6 mil/hour A suitable electroless plating bath for the selective deposition of substantially equal amounts of nickel and cobalt, and about five percent of phosphorus on the catalytic layers 32 and 34 can be deposited from the following electroless plating bath:

Formula 9

Nickel sulphate—15 gm./l.
Cobalt sulphate—10 gm./l.
Ammonium sulphate—42 gm./l.
Sodium citrate—84 gm./l.
Hypophosphorus acid—8 ml./l.
Ammonium hydroxide—13.2 ml./l.
pH—8.5
Temperature—90° C.±1° C.
Rate of deposition—Approx. 1,000 A./min.

I claim:

1. A method of preparing a substrate for depositing a metal on selected portions thereof, in the presence of a catalyst, comprising the steps of:
depositing a masking film, including an oxidizing agent, on the unselected portions of said substrate,
treating the assembly of said substrate and said masking film with a sensitizer capable of being oxidized by said oxidizing agent, whereby said sensitizer is adsorbed on said selected portions to sensitive said selected portions, and whereby said sensitizer coming in contact with said masking film is oxidized by said oxidizing agent to desensitize it and to prevent sensitization of said masking film, and
treating said assembly with an activating solution containing said catalyst, whereby to deposit a thin layer comprising said catalyst on said sensitized selected portions, no catalytic layer being deposited on said masking film.

2. A method of preparing a substrate as described in claim 1, wherein
said masking film is a photoresist,
said oxidizing agent is one selected from the group consisting of potassium permanganate, methyl orange, sodium nitrate, sodium bromate, and sodium chlorate, and said assembly is heated after it is treated with said sensitizer to insure the complete oxidation of said sensitizer on said masking film.

3. A method of preparing a substrate as described in claim 2, wherein the step of treating said assembly with an activating solution comprises immersing said assembly in the activating solution, said activating solution comprising a catalytic metal selected from the group consisting of palladium, rhodium, ruthenium, nickel, gold, and silver.

4. A method of preparing a substrate as described in claim 3, wherein the step of treating said assembly with a sensitizer comprises immersing said assembly in a sensitizing solution, said sensitizing solution being one selected from the group consisting of acidic stannous chloride solution and acidic titanium trichloride solution.

5. A method of preparing a substrate for depositing a metal on selected portions thereof, in the presence of a catalyst, comprising depositing a masking film, including an oxidizing agent capable of oxidizing stannous ions to stannic ions, on the unselected portions of said substrate, treating the assembly of said substrate and said masking film with a sensitizing solution of stannous chloride, whereby stannous ions are adsorbed on said selected portions to sensitize said selected portions, and whereby stannous ions coming in contact with said masking film are oxidized by said oxidizing agent to stannic ions, and thereby densensitizing said masking film, and treating said assembly with an activating solution containing said catalyst, whereby to deposit a thin layer comprising said catalyst on said sensitized selected portions, no catalytic layer being deposited on said masking film.

6. A method of preparing a substrate as described in claim 5, wherein said catalyst comprises palladium, said sensitizing solution comprises acidic stannous chloride, and said activating solution comprises acidic palladium chloride.

7. A method of preparing a substrate as described in claim 6, wherein said assembly is rinsed in water after each of the steps of treating said assembly with said sensitizing solution and said activating solution, and said assembly is heated between about 50° C. and 200° C. for between about 0.5 minute and 5 minutes after said assembly is treated with said sensitizing solution to insure the complete oxidation of said stannous ions in contact with said masking film.

8. A method of preparing a substrate as described in claim 7, wherein said substrate is dielectric material, said masking film is a photosensitive resist, and said oxidizing agent is one selected from the group consisting of $KMnO_4$, methyl orange, $NaNO_3$, $NaBrO_3$, and $NaClO_3$.

9. A method of preparing a substrate as described in claim 7, wherein said metal deposited on said selected portions of said substrate comprises a metal deposited from an electroless plating solution, said metal being one of the group consisting of nickel, cobalt, and copper.

10. In a method of depositing a metal from an electroless plating solution on selected portions of a dielectric substrate, in the presence of a catalyst, wherein the unselected portions of said substrate are covered with a masking film, wherein the assembly of said substrate and said masking film is first treated with a sensitizer, and wherein said assembly is then treated with an activating solution containing said catalyst, the improvement comprising providing said masking film with an oxidizing agent to oxidize said sensitizer that comes in contact with said masking film, whereby to desensitize said masking film and to render it incapable of receiving a deposit of said catalyst thereon.

11. In a method as described in claim 10, the additional step of heating the assembly of said substrate and said masking film to a temperature of at least 50° C. for at least 0.5 minute after said assembly is treated with said sensitizer, whereby to insure substantially complete oxidation of said sensitizer that comes in contact with said masking film.

12. In a method as described in claim 11, wherein said catalyst in said activating solution is a metal selected from the group consisting of palladium, rhodium, ruthenium, cobalt, nickel, silver, and gold, said metal from said electroless plating solution is one selected from the group consisting of nickel and copper, and said masking film is removed after said metal is deposited from said electroless plating solution.

References Cited

UNITED STATES PATENTS

| | | | |
|---|---|---|---|
| 3,443,988 | 5/1969 | McCormack | 117—5.5 |
| 2,848,359 | 8/1958 | Talmey | 117—5.5 |
| 3,262,900 | 7/1966 | Schreiber | 117—5.5 |

ALFRED L. LEAVITT, Primary Examiner

M. F. ESPOSITO, Assistant Examiner

U.S. Cl. X.R.

117—38, 130 E, 212